United States Patent
Kim et al.

(10) Patent No.: US 11,327,593 B2
(45) Date of Patent: May 10, 2022

(54) TOUCH SENSING DEVICE AND ELECTRONIC DEVICE INCLUDING TOUCH SENSING DEVICE

(71) Applicant: SAMSUNG ELECTRO-MECHANICS CO., LTD., Suwon-si (KR)

(72) Inventors: Jong Yun Kim, Suwon-si (KR); Gye Won Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/032,393

(22) Filed: Sep. 25, 2020

(65) Prior Publication Data

US 2022/0014190 A1    Jan. 13, 2022

(30) Foreign Application Priority Data

Jul. 7, 2020    (KR) ........................ 10-2020-0083286

(51) Int. Cl.
  *G06F 3/041* (2006.01)
  *H03K 17/96* (2006.01)
  *H03K 17/95* (2006.01)

(52) U.S. Cl.
  CPC ......... *G06F 3/0414* (2013.01); *H03K 17/952* (2013.01); *H03K 17/96* (2013.01); *G06F 3/0412* (2013.01); *H03K 2217/96038* (2013.01)

(58) Field of Classification Search
  CPC ............... H03K 17/96; H03K 17/952; H03K 17/96038; H03K 17/965; H03K 17/975; H03K 17/962; H03K 2217/96062; H03K 2217/960755; H03K 17/955; H03K 17/9643; H03K 17/9622; H03K 17/9647; H03K 17/9651; H03K 2217/96038; G06F 3/0414; G06F 3/04144; G06F 3/4142
  See application file for complete search history.

(56) References Cited

U.S. PATENT DOCUMENTS

| | | | |
|---|---|---|---|
| 10,466,829 B2 | 11/2019 | Filiz et al. | |
| 2012/0072150 A1* | 3/2012 | Furukawa | G01B 7/00 |
| | | | 702/65 |
| 2012/0306798 A1 | 12/2012 | Zoller et al. | |
| 2012/0313627 A1* | 12/2012 | Furukawa | G06F 3/0338 |
| | | | 324/207.15 |

FOREIGN PATENT DOCUMENTS

| | | |
|---|---|---|
| JP | 2748079 B2 | 5/1998 |
| JP | 2015-32276 A | 2/2015 |
| KR | 10-2012-0125278 A | 11/2012 |
| KR | 10-1714624 B1 | 3/2017 |
| KR | 10-2020-0000061 | 1/2020 |

OTHER PUBLICATIONS

Korean Office Action dated Oct. 28, 2021, in counterpart Korean Patent Application No. 10-2020-0083286 (7 pages in English and 6 pages in Korean).

* cited by examiner

*Primary Examiner* — Xuemei Zheng
(74) *Attorney, Agent, or Firm* — NSIP Law

(57) ABSTRACT

A touch sensing device includes: at least one sensing coil disposed on a substrate; a sensing circuit unit configured to detect applied external pressure, based on a change in inductance of the at least one sensing coil; and a deformation inducing shaft configured to block one side of the at least one sensing coil in one direction and open another side of the at least one sensing coil in another direction.

19 Claims, 6 Drawing Sheets

TOUCH SENSING DEVICE AND ELECTRONIC DEVICE INCLUDING TOUCH SENSING DEVICE

CROSS-REFERENCE TO RELATED APPLICATIONS

This application claims the benefit under 35 USC § 119(a) of Korean Patent Application No. 10-2020-0083286 filed on Jul. 7, 2020 in the Korean Intellectual Property Office, the entire disclosure of which is incorporated herein by reference for all purposes.

BACKGROUND

1. Field

The following description relates to a touch operation sensing device, a sensing coil applicable to a touch operation sensing device, and an electrical apparatus including a touch operation sensing device.

2. Description of Related Art

In general, it is preferable for wearable devices to have thinner, simpler, and sleeker, more elegant designs. Thus, existing mechanical switches are being implemented less frequently in wearable devices. Such designs are possible with the implementation of dustproofing and waterproofing technologies, as well as the development of a model having a smooth design and unity of construction.

Currently, a touch-on-metal (ToM) technology that implements touch inputs on metal, a capacitor sensing technology using a touch panel, a micro-electro-mechanical-system (MEMS), a micro strain gauge technology, and the like are being developed. Further, a force touch function is also being developed.

In the case of a conventional mechanical switch, a large size and space are required internally to implement the switch function, and a conventional mechanical switch may have a structure that is not integral with an external case, or may have a shape protruding outwardly, which causes a disadvantage of not being sleek or elegant, and taking up a lot of space.

In addition, there is a risk of electric shocks due to direct contact with a mechanical switch that is electrically connected, and in particular, there is a disadvantage that it may be difficult to implement dustproofing and waterproofing due to the structure of the mechanical switch.

In order to compensate for the disadvantages described above, a force sensing switch has been developed. However, the conventional force sensing switch may have a malfunction in which a touch that is not intended by a user, is sensed as an operation signal.

More specifically, the force sensor used in the conventional force sensing switch operates using a method of detecting a signal exceeding a preset threshold value, among analog signals generated according to a strength of a pressing of the switch by a user. However, such a method has a problem in that a signal exceeding the preset threshold value can be generated if the user inadvertently applies strong force to a location other than that of the force sensing switch. That is, in the conventional force sensing switch, since sensing can be performed regardless of the position to which the user applies force, malfunctions may frequently occur.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a touch sensing device includes: at least one sensing coil disposed on a substrate; a sensing circuit unit configured to detect applied external pressure, based on a change in inductance of the at least one sensing coil; and a deformation inducing shaft configured to block one side of the at least one sensing coil in one direction and open another side of the at least one sensing coil in another direction.

The deformation inducing shaft may be spaced apart from the at least one sensing coil, and may have a form of a column or a wall blocking the one side of the at least one sensing coil.

The at least one sensing coil may include a plurality of sensing coils arranged side-by-side. The deformation inducing shaft may be disposed between the plurality of sensing coils and may be spaced apart from the plurality of sensing coils by different distances.

The touch sensing device may further include a support member fixing the substrate. The deformation inducing shaft may be installed such that one end of the deformation inducing shaft is bonded to the support member and the deformation inducing shaft extends perpendicular to the support member.

The touch sensing device may further include an elastic member disposed on a lower surface of the support member, and configured to be compressed as the external pressure is applied to the support member.

At least a portion of the support member may be formed to be an open region, and the substrate may be fixed at a position including the open region. The at least one sensing coil may include a first sensing coil mounted on one surface of the substrate and a second sensing coil mounted on another surface of the substrate.

In another general aspect, an electronic device includes: a housing including a touch switch portion in at least some regions of the housing; and a touch sensing device disposed inside the housing, and configured to sense external pressure applied to the touch switch portion. The touch sensing device may be configured to determine that external pressure is normally applied to the touch switch portion, in response to a distance between the housing and the touch sensing device increasing.

The touch sensing device may include: at least one sensing coil disposed on a substrate; and a sensing circuit unit connected to the at least one sensing coil, and configured to detect the external pressure. The sensing circuit unit may be further configured to determine that the external pressure is normally applied to the touch switch portion, in response to the distance between the at least one sensing coil and the housing exceeding a preset reference value.

The touch sensing device may further include a deformation inducing shaft spaced apart from the at least one sensing coil, and extending perpendicular to the housing.

The deformation inducing shaft may be formed in a column shape or a wall shape on one side of the at least one sensing coil, and may be formed to block one side of the at least one sensing coil and open another side of the at least one sensing coil.

The housing may include a touch switch portion and a malfunction portion. A first region of the housing below which the at least one sensing coil is disposed may be determined as a malfunction portion, and a second region of the housing excluding the first region may be determined as a touch switch portion. The deformation inducing shaft may be a boundary between the first region and the second region.

A vertical distance by which the first region of the housing is spaced apart from the at least one sensing coil may increase as external pressure is applied to the touch switch portion.

The at least one sensing coil may include a plurality of sensing coils arranged side by side. The deformation inducing shaft may be disposed between the plurality of sensing coils and may be spaced apart from the plurality of sensing coils different distances.

The touch sensing device may further include a support member fixing the substrate. The deformation inducing shaft may be installed such that one end of the deformation inducing shaft is bonded to the support member and the deformation inducing shaft extends perpendicular to the support member.

The touch sensing device may further include an elastic member disposed on a lower surface of the support member, and configured to be compressed as the external pressure is applied.

At least a portion of the support member may be formed to be an open region, and the substrate may be fixed at a position including the open region. The at least one sensing coil may include a first sensing coil mounted on one surface of the substrate and a second sensing coil mounted on another surface of the substrate.

A lower frame may be disposed below the elastic member, and the housing may be disposed above the support member. The first sensing coil may be disposed between the support member and the housing, and the second sensing coil may be disposed between the support member and the lower frame.

The sensing circuit unit may be further configured to determine that the external pressure is normally applied to the touch switch portion, in response to a distance between the first sensing coil and the housing exceeding a preset reference value, and a distance between the lower frame and the second sensing coil decreasing.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
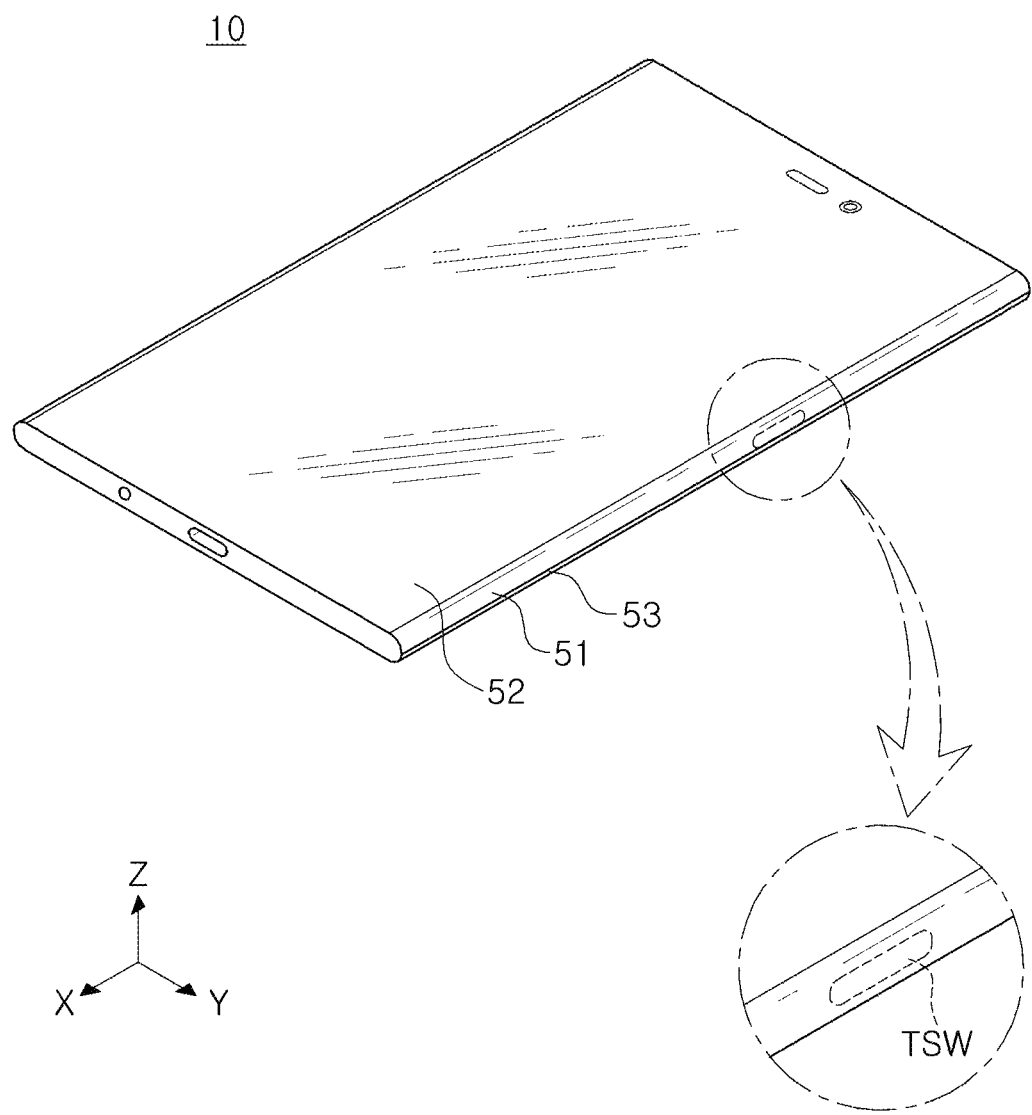
FIG. 1 is a view of an appearance of an electronic device, according to an embodiment.
Figure 1:
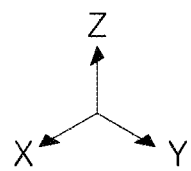

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

FIG. 1 is a view of an appearance of an electronic device 10, according to an embodiment.

Referring to FIG. 1, the electronic device 10 may include, for example, a housing 51, a front display glass 52, a rear cover 53, and a touch switch portion TSW.

The housing 51 may structure covering at least a portion of the electronic device 10, and at the same time, may be integrally formed with a structure forming a central framework of the electronic device 10. The housing 51 may be formed of various materials according to types and configurations of the electronic device 10. For example, when the electronic device 10 is a smartphone, as illustrated by way of example in FIG. 1, the housing 51 may be formed of a material of a metal frame. Alternatively, the housing 51 may also be formed of a non-conductive material such as glass.

The front display glass 52 may be disposed on one side of the housing 51, and the rear cover 53 may be disposed on the other side of the housing 51. That is, the electronic device 10 may include a side surface having a two layer structure or a three-layer structure composed of the front display glass 52, the housing 51, and the rear cover 53.

The touch switch portion TSW may be a portion formed on a side surface of the electronic device 10 to replace a mechanical button. The touch switch portion TSW may correspond to a portion to which a touch input is applied, for example, a contact surface to which pressure is applied by a user's hand. In addition, referring to FIG. 1, the touch switch portion TSW may correspond to at least a portion of the housing 51.

Referring to FIG. 1, the electronic device 10 may be a portable device such as a smartphone, or the like, or may be a wearable device such as a smart watch. However, the electronic device 10 is not limited to a specific device, and the electronic device 10 may be a portable or wearable electronic device, or an electronic device having a switch for controlling an operation.

For example, the electronic device 10 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like, but is not limited to such examples.

In an electronic device such as a general mobile phone, a volume button or a power button may be formed on a side surface of the electronic device as a physical button (key). In this case, the physical button may protrude outwardly such that the physical button can be pressed with a user's hand. However, when using a physical button, there is a durability lifespan issue caused by wear and the like, and there is a limitation that it is difficult to waterproof the physical button.

Embodiments proposed to address the aforementioned limitations will be described with reference to FIGS. 2 to 11.

For each drawing figure of this disclosure, unnecessary duplicate descriptions may be omitted for the same reference numerals and components having the same function, and possible differences for each drawing figure may be described.

Figure 2:
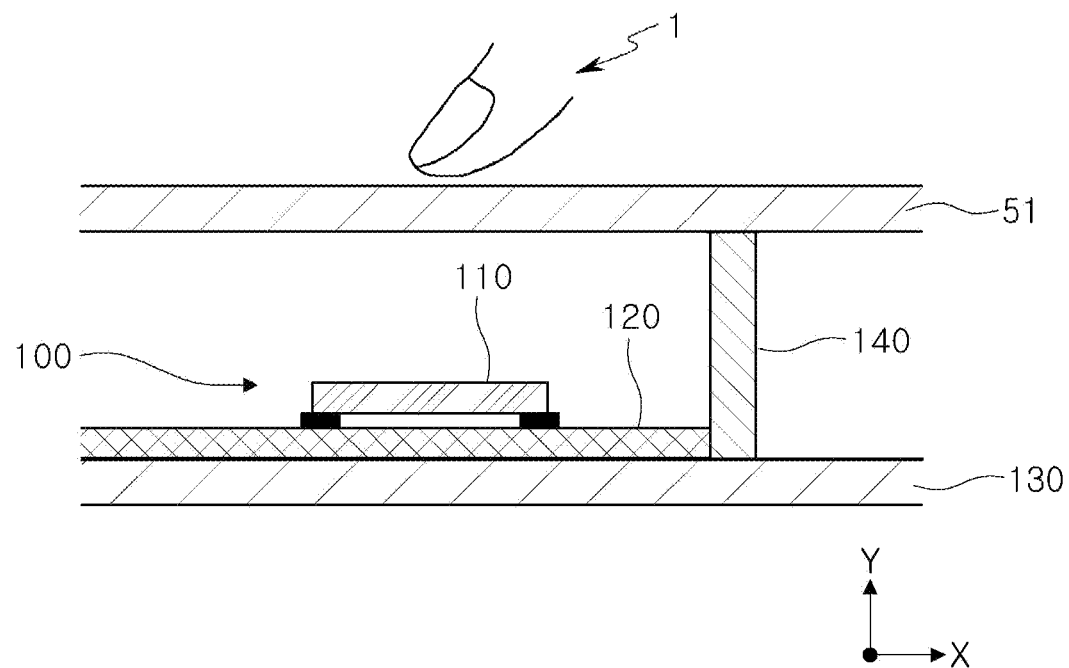
FIG. 2 is a view of an electronic device, according to an embodiment.

FIG. 2 is a view of the electronic device 10, according to an embodiment.

Referring to FIG. 2, an example concept of this disclosure is to sense a degree of inward bending of the housing 51 when pressure is applied to the touch switch portion TSW with a user's hand 1, to enable force input without a physical button on a side surface of the electronic device 10.

As described with reference to FIG. 1, the electronic device 10 may have the housing 51 such as a metal frame, or the like, at a central portion of the electronic device 10, and the front display glass 52 may be disposed above the housing 51 and the rear cover 53 may be disposed below the housing 51. In this case, the rear cover 53 may be, for example, a back glass.

More specifically, referring to FIGS. 1 and 2, the electronic device 10 may include the housing 51, and the housing 51 may include the touch switch portion TSW in at least some regions.

In addition, as shown in FIG. 2, the electronic device 10 may include a touch sensing device 100, and the touch sensing device 100 may be inserted into and disposed inside the housing 51. The touch sensing device 100 may sense external pressure applied to the touch switch portion TSW of the housing 51.

The touch sensing device 100 is a device capable of detecting a touch input. For reference, a touch, a touch input, and touch application may include a contact touch that makes contact without force, and a force touch that involves a force by a pressing action (pressure). For example, the disclosure herein focuses on the force touch input by inductive sensing. In addition, hereinafter, a force input means an input by a force touch to which pressure is applied, among touch inputs.

For example, referring to FIGS. 1 and 2, force may be applied to the touch switch portion TSW of the housing 51 by a user's hand 1. Accordingly, the housing 51 may be bent inwardly around the position of the touch switch portion TSW, and a change in size of an air gap formed by the touch sensing device 100 and the housing 51 may be caused.

In this case, when the size of the air gap changes, an inductance changes. Therefore, when a change in the inductance equal to or greater than a reference value is detected, the touch sensing device 100 may detect that a force touch input is applied to the touch switch portion TSW.

Referring to FIG. 2, the touch sensing device 100 may include, for example, a sensing coil 110, a substrate 120, and a support member 130. At least one sensing coil 110 may be disposed on the substrate 120. In addition, the substrate 120 may be fixed inwardly of the housing 51 by the support member 130.

When the touch sensing device 100 is inserted into the electronic device 10, the support member 130, the substrate 120, and the sensing coil 110, which is disposed on the substrate 120, may be disposed parallel to the inner side surface of the housing 51. In this case, the sensing coil 110, which is disposed on an uppermost portion of the touch sensing device 100, may be spaced apart from the housing 51, and an air gap may be disposed between the sensing coil 110 and the housing 51.

The shape of the sensing coil 110 is not particularly limited, and a coil pattern of the sensing coil 110 may be formed in various shapes such as a circle, a square, or the like. In addition, it is also possible to form the sensing coil 110 in a form of a wiring pattern on a PCB or FPCB, or to configure the sensing coil 110 in a form of a chip inductor.

The touch sensing device 100 may detect that the housing 51 is deformed by the force of the user's hand 1 pressing the touch switch portion TSW. That is, when the user's hand 1 presses the touch switch portion TSW, the housing 51 is bent such that the housing 51 moves closer to the sensing coil 110, and accordingly, a distance between the sensing coil 110 and the housing 51 changes.

The housing 51 may be made of, for example, aluminum or another metal. As an example, when the housing 51 is made of metal, while a current flows through the sensing coil 110, the distance between the housing 51, which is a surrounding conductor, and the sensing coil 110 may be changed to generate an eddy current. By the eddy current being generated according to the change in distance, a change in inductance of the sensing coil 110 occurs.

In addition, the resonance frequency may change according to the change in inductance. The touch sensing device 100 may detect a change in pressure applied to the touch switch portion TSW based on the above-described change in the resonance frequency, and recognize the change in resonance frequency as a force touch input.

The substrate 120 may correspond to an FPCB, but is not limited thereto. That is, various types of substrates having a structure in which at least one metal layer and at least one wiring layer are alternately stacked, other than the FPCB, may all be used. At least one sensing coil 110 may be disposed on one surface of the substrate 120. For example, a plurality of sensing coils 110 may be electrically connected to each other by the substrate 120. The sensing circuit unit 200 and the sensing coil 110, which will be described later, may also be electrically connected to each other by the substrate 120.

The support member 130 may fix the substrate 120 on which the sensing coil 110 is disposed. In addition, the support member 130 may be attached to an internal structure of the electronic device 10 as shown in FIG. 2. The support member 130 may be implemented in various forms depending on the type of electronic device 10 applied and the shape of the internal structure thereof, and is not limited to a special shape or structure. For example, the support member 130 may have a structure in which the substrate 120 is fixed on one surface of the support member 130, and the other surface of the support member 130 may be attached to the internal structure of the electronic device 10 (for example, a bracket, or the like).

The touch sensing device 100 including the support member 130 may be inserted into and disposed inside the electronic device 10.

Figure 3:
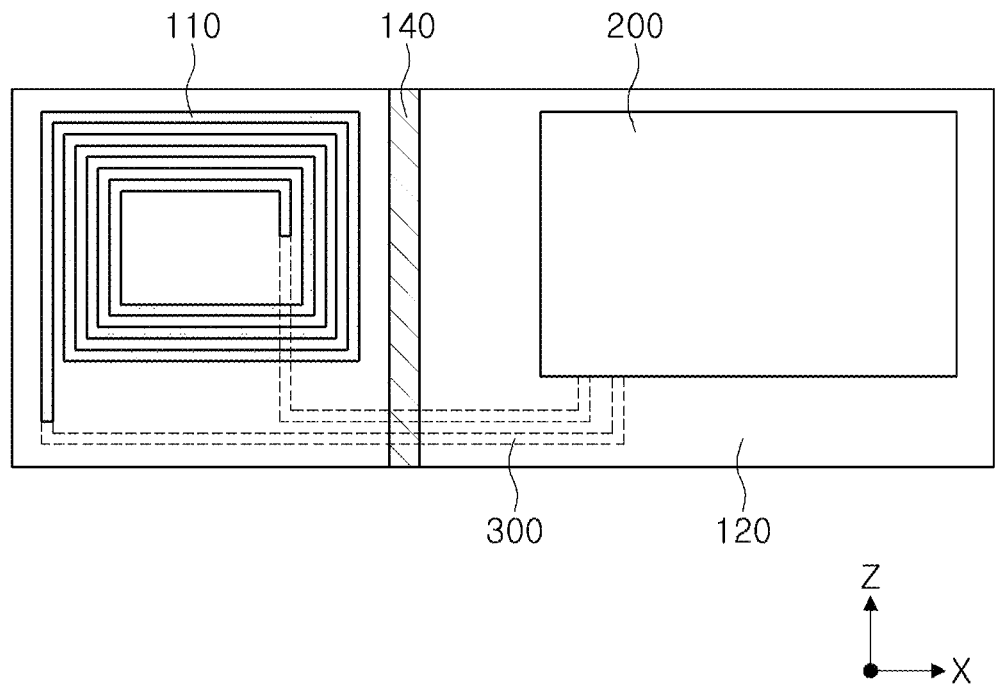
FIG. 3 is a view of a deformation inducing shaft disposed adjacent to a sensing coil, according to an embodiment.

FIG. 3 is a view of a deformation inducing shaft 140 disposed adjacent to the sensing coil 110, according to an embodiment. Specifically, FIG. 3 is a front view illustrating the deformation inducing shaft 140 being included, while the sensing coil 110 and the sensing circuit unit 200 are disposed on the substrate 120.

Referring to FIG. 3, the touch sensing device 100 may include the deformation inducing shaft 140. In addition, the deformation inducing shaft 140 may be installed to be spaced apart from the sensing coil 110, and may be formed in the form of a column or wall configured to block one side of the sensing coil 110.

The deformation inducing shaft 140 may be configured to function as a lever when the user applies pressure to the housing 51. For example, when the user's hand 1 presses the housing 51 at a specific point, the housing 51 at the point at which the pressure is applied is bent in an inward direction. In this case, the deformation inducing shaft 140 may serve as a lever, such that the housing 51 is bent in an outward direction at a point opposite to the point pressed by the user based on the deformation inducing shaft 140.

An example of a function of the deformation inducing shaft 140 will be described in more detail with reference to FIGS. 5 to 7.

The deformation inducing shaft 140 may form asymmetrical spaces on opposite sides of the sensing coil 110. For example, as illustrated in FIG. 3, when the deformation inducing shaft 140 is installed on a right side of the sensing coil 110, a space on the right side of the sensing coil 110 is blocked by the deformation inducing shaft 140. On the other hand, a space on a left side of the sensing coil 110 in which the deformation inducing shaft 140 is not installed, is not blocked by deformation inducing shaft 140. Therefore, the space in which the sensing coil 110 is disposed may be blocked in one direction by the deformation inducing shaft 140, and the space in which the sensing coil 110 is disposed may be open in one direction.

Additionally, the deformation inducing shaft 140 may be made of various materials regardless of conductive or non-conductive materials. That is, as the user applies pressure to the housing 51, it is sufficient for the deformation inducing shaft 140 to function as a lever in the form of a column or a wall, so it is irrelevant whether the deformation inducing shaft 140 is made of an insulator. However, since the structure of the deformation inducing shaft 140 must be maintained despite the pressure applied and the deformation of the housing 51, the deformation inducing shaft 140 may preferably be made of a material having high strength. In addition, since the deformation inducing shaft 140 is a component installed in the electronic device 10, it may be preferable to form the deformation inducing shaft 140 from a lightweight material.

Referring to FIG. 3, the touch sensing device 100 may include the sensing circuit unit 200. The sensing circuit unit

200 may be connected to the sensing coil 110, to detect the applied external pressure. In this case, as illustrated in FIG. 3, the sensing coil 110 and the sensing circuit unit 200 may be electrically connected through a circuit connection portion 300.

The sensing circuit unit 200 may be a sensor IC (an integrated circuit). The sensing circuit unit 200 may detect the applied external pressure based on the change in inductance of the sensing coil 110.

For example, when pressure is applied to the housing 51, a distance between the housing 51 and the sensing coil 110 may be changed to generate an eddy current. Accordingly, a change in inductance of the sensing coil 110 may occur. The sensing circuit unit 200 may detect a change in the resonance frequency from the above-described change in inductance, and accordingly, may recognize that a force touch input is applied to the touch switch portion TSW.

Figure 4:
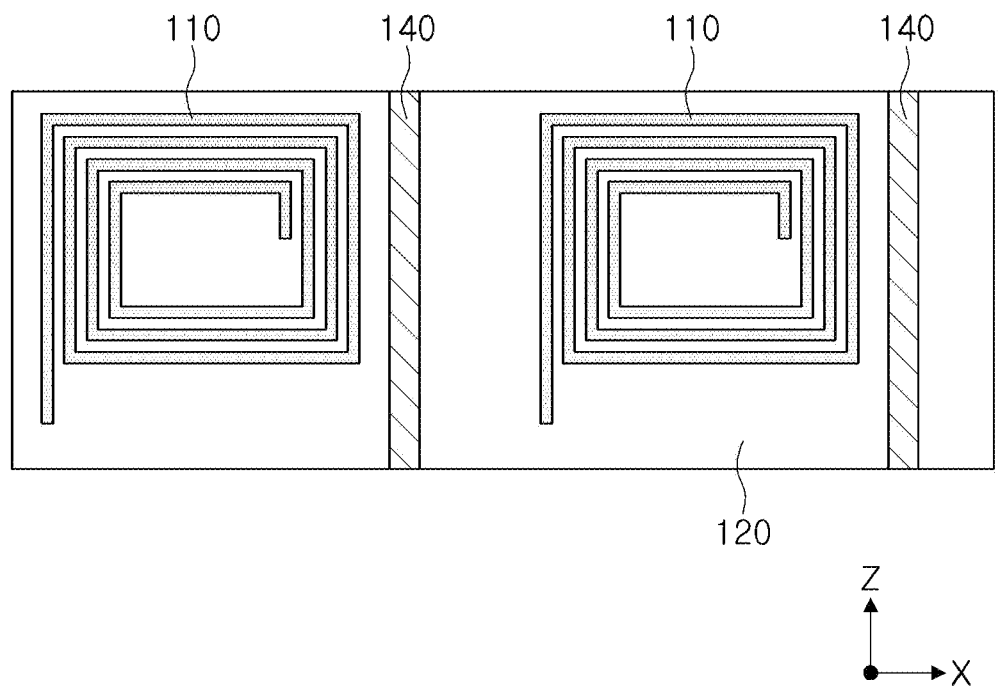
FIG. 4 is a view of a plurality of strain induction shafts disposed between a plurality of sensing coils, according to an embodiment.

FIG. 4 is a view of a plurality of deformation inducing shafts 140 disposed between a plurality of sensing coils 110, according to an embodiment.

The touch sensing device 100 may include a plurality of sensing coils 110. In this case, the plurality of sensing coils 110 may be variously arranged according to the type of the electronic device 10 or the shape of the housing 51. As an example, the plurality of sensing coils 110 may be arranged side-by-side as shown in FIG. 4.

Referring to FIG. 4, the deformation inducing shaft 140 disposed between the adjacent sensing coils 110 may be disposed to be spaced apart from the adjacent sensing coils 110 on both sides thereof by different distances.

For example, as illustrated in FIG. 4, when the deformation inducing shaft 140 is installed on a right side of one sensing coil 110, a space on the right side of the one sensing coil 110 is blocked. When the deformation inducing shaft 140 is installed on the right side of the other sensing coil 110, the space on the right side of the other sensing coil 110 is also blocked. However, the space on the left side of the sensing coils 110 is not blocked because the deformation inducing shaft 140 is not disposed on the left side of the sensing coils 110 or is not disposed close to the sensing coils 110 on the left side of the sensing coils 110. Therefore, the deformation inducing shafts 140 may be disposed between adjacent sensing coils 110 on both sides of the deformation inducing shafts 140 and spaced apart from the adjacent sensing coils 110 on both sides by different distances.

Figure 5:
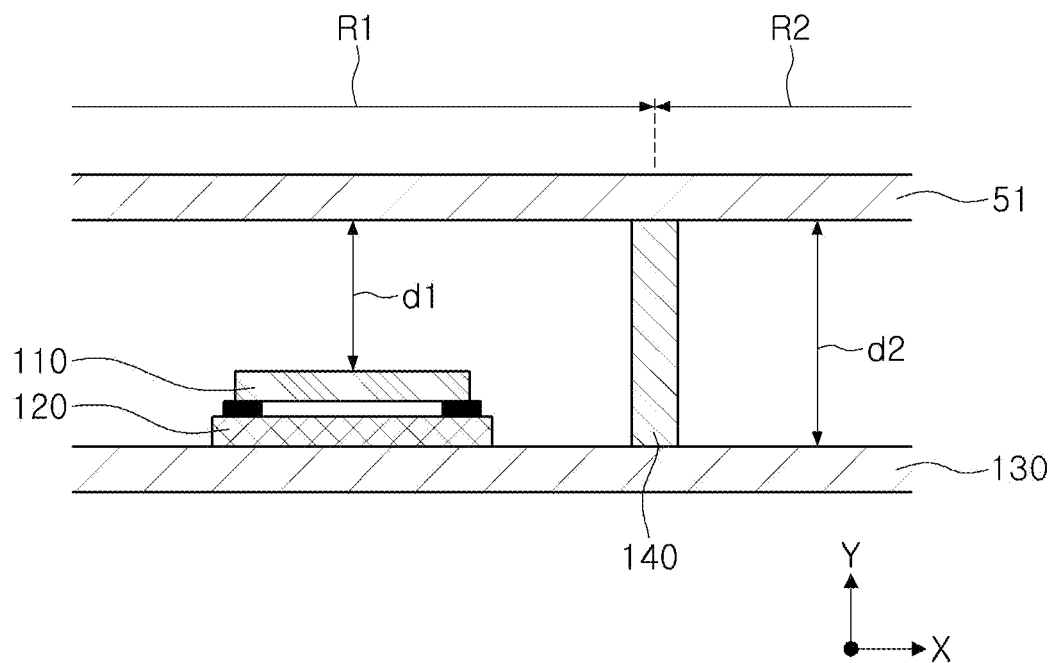
FIG. 5 is a view in which a touch sensing device, according to an embodiment, is inserted into and disposed inside a housing.

FIG. 5 is a view in which the touch sensing device 100, according to an embodiment, is inserted into and disposed inside the housing 51.

Referring to FIG. 5, the touch sensing device 100 may be inserted into and disposed inside the housing 51. For example, as illustrated in FIG. 5, the housing 51 may have an internal space having a spacing d2 between the support member 130 and the housing 51, and the touch sensing device 100 may be inserted detachably into the internal space. In this case, the support member 130 may be attached on one surface of the housing 51, and the substrate 120, on which the sensing coil 110 is disposed, may be fixed to the support member 130.

In addition, as illustrated in FIG. 5, the sensing coil 110, which is disposed on an uppermost portion of the touch sensing device 100, may be installed to be spaced apart from the housing 51. In this case, an air gap extending a distance d1 between the sensing coil 110 and the housing 51 may be formed.

Referring to FIG. 5, as described with reference to FIG. 3, the touch sensing device 100 may include the deformation inducing shaft 140. The deformation inducing shaft 140 may be installed to be spaced apart from the sensing coil 110, and may be formed in a form of a column or a wall perpendicular to the housing 51. Accordingly, the deformation inducing shaft 140 may block one side of the sensing coil 110.

In addition, as an example, the deformation inducing shaft 140 may be installed such that one end thereof is bonded to the support member 130 and the deformation inducing shaft extends perpendicular to the support member 130. When the deformation inducing shaft 140 is installed in this manner, the touch sensing device 100 may be integrally inserted into the internal space of the cover member 51.

In addition, the deformation inducing shaft 140 is installed only on one side of the sensing coil 110, and is not installed on the other side of the sensing coil 110. For example, as illustrated in FIG. 5, the deformation inducing shaft 140 may be installed on a right side of the sensing coil 110, and the deformation inducing shaft 140 may not be installed on a left side of the sensing coil 110. Accordingly, one side of the sensing coil 110 may be blocked in one direction, and the other side of the sensing coil 110 may be open in one direction.

Referring to FIG. 5, the housing 51 may be divided into a first region R1 and a second region R2 based on a contact point with the deformation inducing shaft 140. Here, the first region R1 may be one region of the housing 51 corresponding to an internal region in which the sensing coil 110 is installed. That is, the sensing coil 110 is disposed below the first region R1 of the housing 51. In this case, the first region R1 and the sensing coil 110 may be spaced apart by the air gap having the length d1 between the first region R1 and the sensing coil 110.

In addition, the second region R2 may be one region of the cover member 51 corresponding to an internal region in which the sensing coil 110 is not installed, based on the deformation inducing shaft 140. That is, the sensing coil 110 is not disposed directly below the second region R2 of the cover member 51.

According to an embodiment, the second region R2 may be determined as the touch switch portion TSW. That is, when pressure greater than a reference value is applied to the second region R2, the touch sensing device 100 may detect that a force touch input is normally applied. As described above, the second region R2 is determined as a touch switch portion TSW, which, as will be described below, is related to using a reverse-sensing algorithm.

When a distance between the housing 51 and the touch sensing device 100 increases, the touch sensing device 100 may determine that external pressure is normally applied to the touch switch portion TSW. That is, the method by which the touch sensing device determines whether external pressure is normally applied is contrary to a method in which a conventional touch sensor detects that the distance between the housing 51 and the touch sensing device 100 is moving closer.

For example, when the distance between the sensing coil 110 and the housing 51 exceeds a preset reference value, the sensing circuit unit 200 may determine that external pressure is normally applied to the touch switch portion TSW. That is, the touch sensing device 100 may be configured to recognize the sensing coil 110 and the housing 51 being separated from each other as a normal force input.

By the reverse sensing algorithm described above, a problem in which malfunctions frequently occur in the touch sensor may be avoided.

As described above, the housing 51 may include the touch switch portion TSW in at least some regions. In addition, a region of the housing 51 except for the touch switch portion TSW may correspond to a malfunction portion. That is, the housing 51 may include a touch switch portion TSW for generating a normal operation signal, and a malfunction portion.

According to an embodiment, the first region R1 may be determined as a malfunction portion, and the second region R2, which excludes the first region R1, may be determined by the touch switch portion TSW. Therefore, when the user applies pressure exceeding a reference value to the first region R1, the pressure applied to the first region R1 may be determined as a malfunction by the touch sensing device 100. Conversely, when the user applies pressure exceeding a reference value to the second region R2, the pressure applied to the second region R2 may be determined as a normal force input by the touch sensing device 100, and may generate a normal operation signal.

Figure 6:
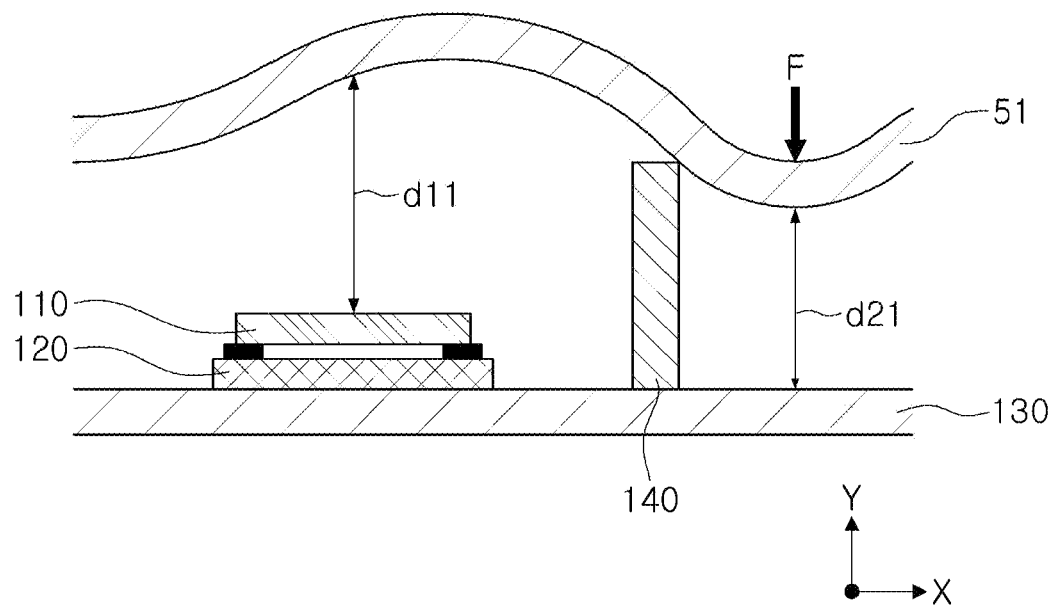
FIG. 6 is a view of a state in which external pressure is applied to a second region of FIG. 5, according to an embodiment.
Figure 7:
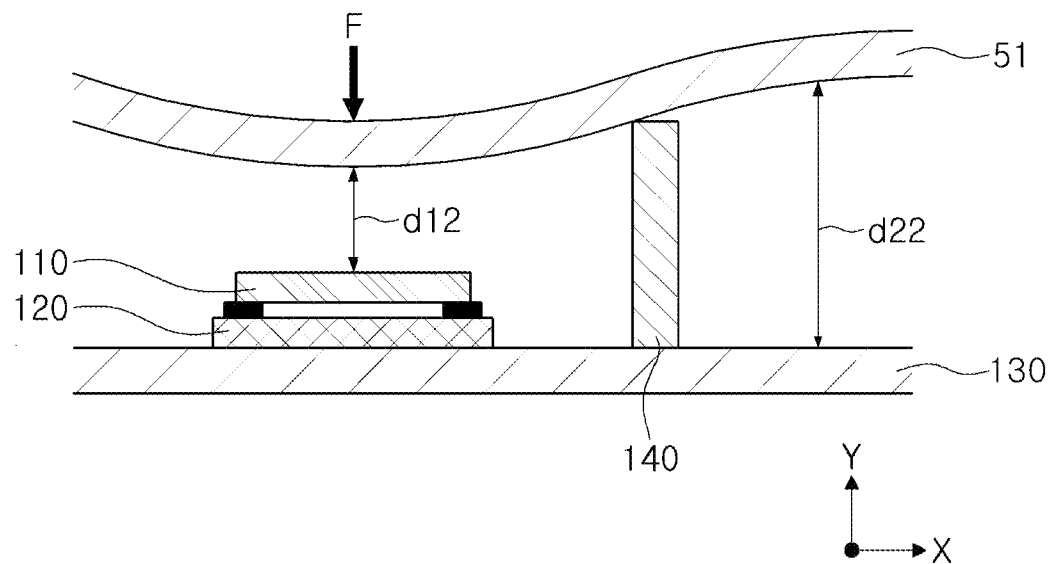
FIG. 7 is a view of a state in which external pressure is applied to a first region of FIG. 5, according to an embodiment.

Examples in which force is applied to the first region R1 and the second region R2 to apply a force touch input are illustrated in FIGS. 6 and 7, respectively, and will be described below.

FIG. 6 is a view of a state in which external pressure is applied to the second region R2. FIG. 7 is a view of a state in which external pressure is applied to the first region R1.

Referring to FIGS. 5 and 6 together, when external pressure F is applied to the second region R2 of the housing 51, deformation of the housing 51 may occur as illustrated in FIG. 6. That is, the second region R2, which is a point at which the pressure is directly applied, is bent inwardly (downwardly in FIG. 6).

In this case, since the deformation inducing shaft 140 serves as a lever, a point opposite to the point at which the pressure is applied based on the deformation inducing shaft 140 is bent outwardly (upwardly in FIG. 6). Accordingly, the first region R1 of the housing 51 is disposed farther from the sensing coil 110 than before the deformation.

For reference, the housing 51 is made of a material having ductility, and thus can easily deform as the user applies pressure thereto. In addition, by being made of a material having elasticity, the housing 51 can be easily returned to its original position after the deformation. For example, the housing 51 may be made of various metal materials, and alloys in which metal materials such as soft iron, tungsten, phosphor bronze, chromoly, and the like, are added may be used.

Comparing FIG. 5, which illustrates a state before the deformation, and FIG. 6, which illustrates a state after the deformation, it can be confirmed that the second region R2 of the housing 51 is deformed by the external pressure F so that the length of the air gap formed between the support member 130 and the region R2 is changed from d2 to d21. On the contrary, it can be confirmed that the first region R1 of the housing 51 is bent outwardly by the deformation inducing shaft 140, so that the length of the air gap formed between the sensing coil 110 and the region R1 increases from d1 to d11.

As described above, according to an embodiment, since the second region R2 is determined as the touch switch portion TSW, FIG. 6 corresponds to a case in which the user applies pressure to the touch switch portion TSW. That is, since the distance between the first region R1 and the sensing coil 110 increases because the user applies pressure to the second region R2, when the external pressure is applied to the touch switch portion TSW, a vertical spacing between the sensing coil 110 and the housing 51 may increase.

In addition, when the distance between the housing 51 and the touch sensing device 100 increases, it can be confirmed that the touch sensing device 100 may determine that the external pressure is normally applied to the touch switch portion TSW. Therefore, when the air gap of the first region R1 increases as illustrated in FIG. 6, the touch sensing device 100 may generate a normal force input signal.

When the housing 51 is made of metal, while a current flows through the sensing coil 110, the distance between the first region R1 of the housing 51 and the sensing coil 110 may increase to generate an eddy current. By the eddy current being generated according to the change in distance, a change in inductance and a change in resonance frequency of the sensing coil 110 are generated.

In this case, the sensing circuit unit 200 may determine whether the corresponding pressing operation is a normal force input, based on the change in inductance and the change in resonance frequency. That is, when the change in inductance and the change in resonance frequency are changes according to the result of an increase in the air gap, the corresponding pressing operation may be recognized as a force input applied to the touch switch portion TSW.

In addition, even if pressure is applied to the second region R2 corresponding to the touch switch portion TSW as illustrated in FIG. 6, the corresponding pressing operation may be detected as a normal force input only when the size of the force input exceeds a preset reference value. That is, a user may unintentionally touch the touch switch portion TSW while carrying the electronic device 10. Therefore, when the distance between the sensing coil 110 and the housing 51 exceeds a preset reference value, the sensing circuit unit 200 may determine that external pressure is normally applied to the touch switch portion TSW.

Referring to FIGS. 5 and 7 together, when external pressure F is applied to the first region R1 of the housing 51, deformation of the housing 51 may occur as illustrated in FIG. 7. That is, the first region R1, which is a point at which the pressure is directly applied, is bent inwardly (downwardly in FIG. 7). Accordingly, the first region R1 of the housing 51 is disposed closer to the sensing coil 110 than before the deformation.

Comparing FIG. 5, which illustrates a state before the deformation, and FIG. 7, which illustrates a state after the deformation, it can be confirmed that the first region R1 of the housing 51 is deformed by the external pressure F so that a length of the air gap formed between the sensing coil 110 and the region R1 is reduced from d1 to d12. Alternatively, it can be confirmed that the second region R2 of the housing 51 may be bent outwardly by the deformation inducing shaft 140, so that the length of the air gap formed between the support member 130 and the region R2 increases from d2 to d22.

As described above, according to an embodiment, since the first region R1 is determined as a malfunction portion, FIG. 7 corresponds to a case in which a user applies pressure to the malfunction portion. In addition, the touch sensing device 100 may determine that external pressure is normally applied to the touch switch portion TSW, when the distance between the housing 51 and the sensing coil 110 increases. Therefore, when the air gap of the first region R1 decreases, as shown in FIG. 7, the touch sensing device 100 may determine that the corresponding pressure is not a normal force input applied to the touch switch portion TSW. That is, the corresponding pressure may be determined as a malfunction that is not intended by the user.

When the housing 51 is made of metal, while a current flows through the sensing coil 110, the distance between the first region R1 of the housing 51 and the sensing coil 110 may decrease to generate an eddy current. By the eddy current being generated according to the change in distance, a change in inductance and a change in resonance frequency of the sensing coil 110 are generated.

In this case, the sensing circuit unit 200 may determine whether the corresponding pressing operation is a normal force input based on the change in inductance and the change in resonance frequency. That is, when the change in inductance and the change in resonance frequency change are changes according to a result of a decrease in the air gap, the corresponding pressing operation may be recognized as pressure applied to the malfunction portion.

Figure 8:
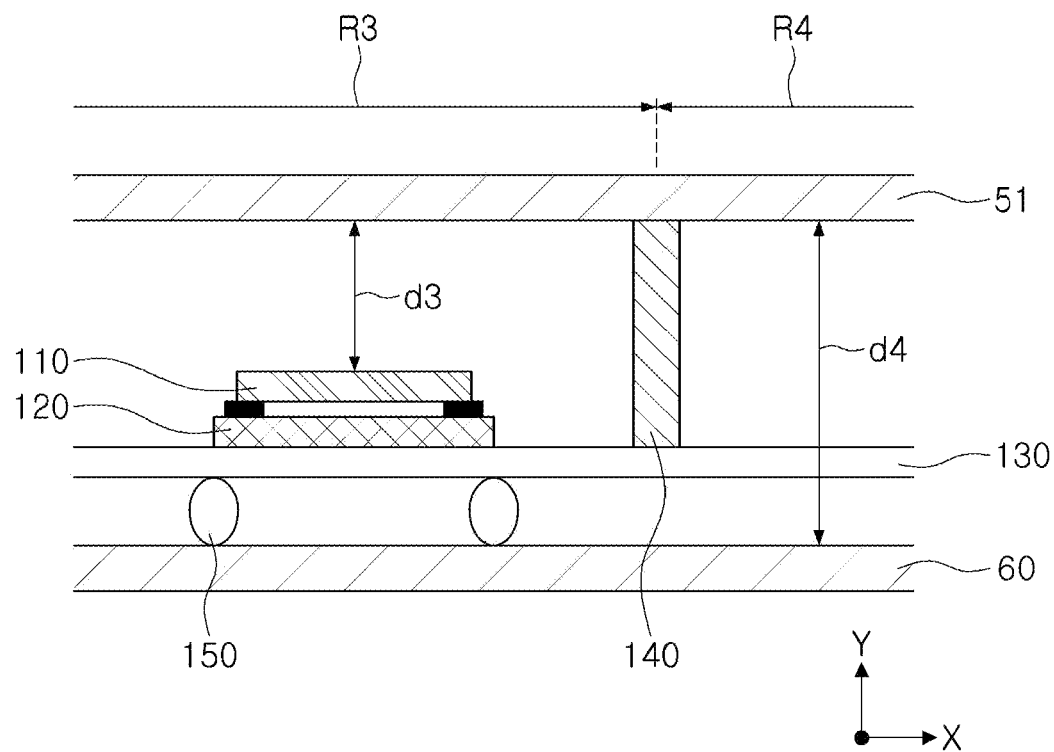
FIG. 8 is a view in which an elastic member, according to an embodiment, is disposed in a touch sensing device.

FIG. 8 is a view in which an elastic member 150 is provided in the touch sensing device 100, according to an embodiment.

Referring to FIG. 8, the touch sensing device 100 may include the elastic member 150 on a lower surface of the support member 130. The elastic member 150 may be compressed when external pressure F is applied.

Referring to FIG. 8, a sensing coil 110 may be disposed on an uppermost portion of the touch sensing device 100. In addition, the substrate 120, on which the sensing coil 110 is mounted, may be disposed below the sensing coil 110, and a support member 130 fixing the substrate 120 may be disposed below the substrate 120. In this case, as illustrated in FIG. 8, the configuration elastic member 150 may be added to the lower portion of the support member 130. A lower frame 60 may be provided below the elastic member 150. The lower frame 60 may be made of a conductive or non-conductive material, regardless of a special shape or structure, and the lower frame 60 may have any structure that allows the elastic member 150 to be provided thereabove.

The elastic member 150 may be formed of various materials that can be compressed by pressure. Referring to FIG. 8, since the support member 130 and the housing 51 are connected through a deformation inducing shaft 140, when pressure is applied to the housing 51, pressure may be applied to the elastic member 150 located below the support member 130.

Referring to FIG. 8, the housing 51 may be divided into a third region R3 and a fourth region R4 based on a contact point with the deformation inducing shaft 140. The third region R3 may be one region of the housing 51 corresponding to an internal region in which the sensing coil 110 is installed. That is, the sensing coil 110 is disposed below the third region R3 of the housing 51, and the third region R3 and the sensing coil 110 may be spaced apart by an air gap having a length d3. In this case, the third region R3 illustrated in FIG. 8 may correspond to the first region R1 illustrated in FIG. 5.

In addition, the fourth region R4 may be one region of the cover member 51 corresponding to an inner region in which the sensing coil 110 is not installed, based on the deformation inducing shaft 140. That is, a sensing coil 110 is not disposed directly below the fourth region R4 of the cover member 51. In this case, the fourth region R4 illustrated in FIG. 8 may correspond to the second region R2 illustrated in FIG. 5.

Similar to the second region R2 being determined as the touch switch portion TSW, the fourth region R4 may be determined as the touch switch portion TSW. That is, when pressure greater than a reference value is applied to the fourth region R4, the touch sensing device 100 may detect that the force input is normally applied.

Figure 9:
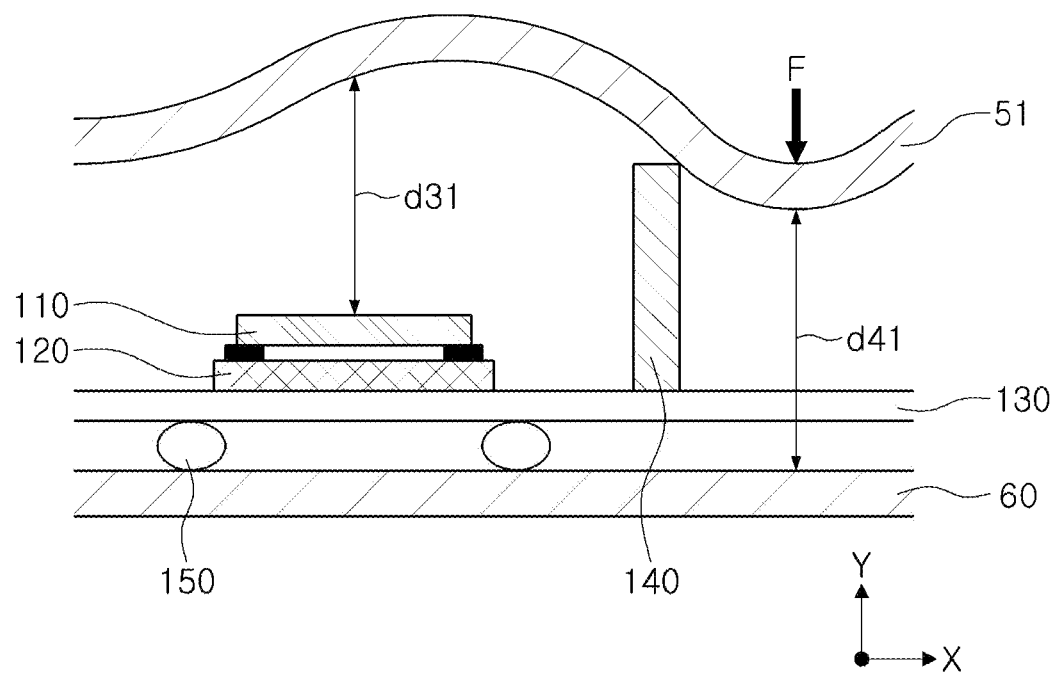
FIG. 9 is a view of a state in which external pressure is applied to a fourth region of FIG. 8, according to an embodiment.

An example in which pressure is applied to the fourth region R4 and a force input is applied thereto is illustrated in FIG. 9, and will be described below.

FIG. 9 is a view of a state in which external pressure is applied to the fourth region R4 of FIG. 8.

Referring to FIGS. 8 and 9 together, when external pressure F is applied to the fourth region R4 of the housing 51, deformation of the cover member 51 may occur as illustrated in FIG. 9. That is, the fourth region R4, which is a point at which the pressure is directly applied, is bent inwardly (downwardly in FIG. 9).

In addition, since the deformation inducing shaft 140 serves as a lever, an opposite point, symmetrical to the point at which the pressure is applied based on the deformation inducing shaft 140 is bent outwardly (upwardly in FIG. 9). Accordingly, the third region R3 of the housing 51 is disposed farther from the sensing coil 110 than before the deformation.

In this case, since an elastic member 150 is provided below the support member 130, a degree of bending of the fourth region R4 may be increased while the elastic member 150 is compressed. Then, a degree of bending of the third region R3 may also be increased, and thus the distance between the third region R3 of the housing 51 and the sensing coil 110 may also be increased.

Comparing FIG. 8, illustrating a state before the deformation and FIG. 9 illustrating a state after the deformation, it can be confirmed that the fourth region R4 of the housing 51 is deformed by the external pressure F so that the length of the air gap between the fourth region R4 and the lower frame 60 is reduced from d4 to d41. On the other hand, the third region R3 of the housing 51 is bent outwardly by the deformation inducing shaft 140, so it can be seen that the length of the air gap formed between the sensing coil 110 and the region R3 increases from d3 to d31. In addition, it can be seen that a change rate from the length d3 to the length d31 is increased by compression of the elastic member 150 being provided below the support member 130.

When the housing 51 is made of a metal material, while a current flows through the sensing coil 110, the distance between the third region R3 of the housing 51 and the sensing coil 110 may increase to generate an eddy current. By the eddy current being generated according to the change in distance, a change in inductance and a change in resonance frequency of the sensing coil 110 are generated.

In this case, since the change in distance is increase by the compression of the elastic member 150, the change in the inductance and the change in the resonance frequency of the sensing coil 110 may also be increased. Therefore, even if the same pressure is applied to the sensing circuit unit 200, the force input can be more sensitively detected when the elastic member 150 is provided.

As described above, since the fourth region R4 is determined as the touch switch portion TSW, FIG. 9 corresponds to a case in which the user applies pressure to the touch switch portion TSW. When the distance between the housing 51 and the touch sensing device 100 increases, the touch sensing device 100 may determine that external pressure is normally applied to the touch switch portion TSW. Therefore, as illustrated in FIG. 9, the touch sensing device 100 may generate a normal force input signal when the air gap of the third region R3 increases.

In addition, since the third region R3 is determined as a malfunctioning portion, when a user applies pressure to the third region R3, the pressure applied to the third region R3 is not recognized as a normal force input. More specifically, when the user applies pressure to the third region R3, the air gap between the sensing coil 110 and the third region R3 is reduced. In this case, as illustrated in FIG. 9, since the elastic member 150 is provided below the support member 130, a reduction rate of the air gap between the sensing coil 110 and the third region R3 may be increased.

In addition, when the air gap of the third region R3 decreases, the touch sensing device 100 may determine that the corresponding pressure is not a normal force input applied to the touch switch portion TSW. Therefore, when the elastic member 150 is provided, the touch sensing device 100 can more sensitively determine a malfunction that is not intended by the user.

Figure 10:
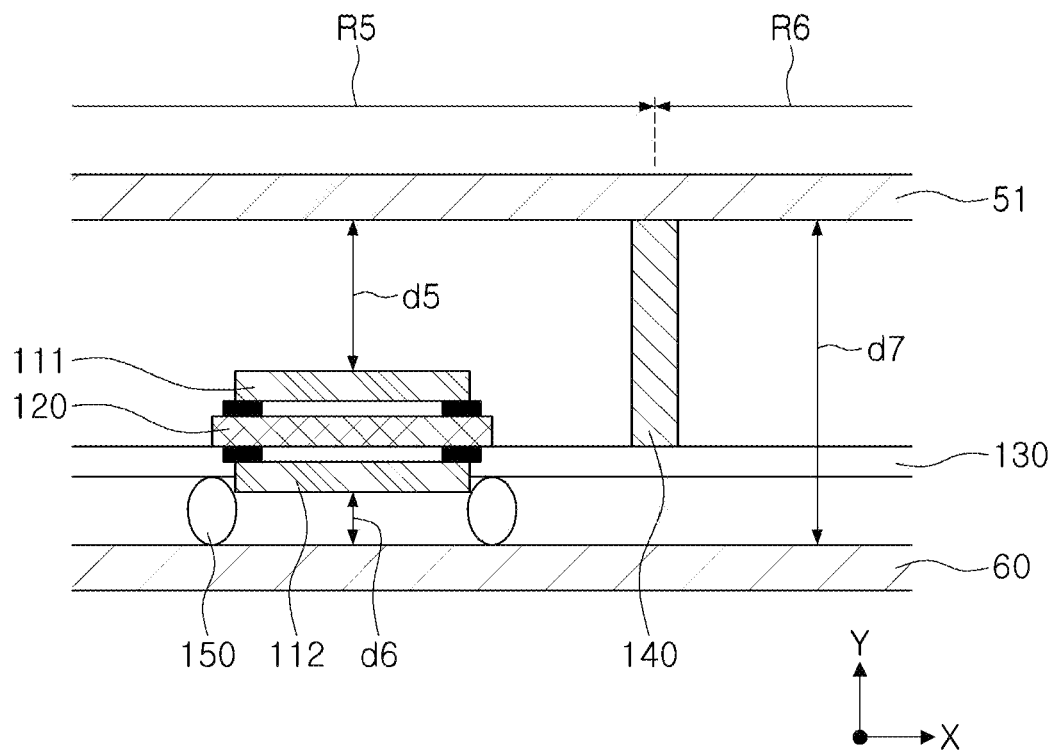
FIG. 10 is a view in which sensing coils are mounted on one surface and another surface of a substrate of FIG. 8, according to an embodiment.
Figure 11:
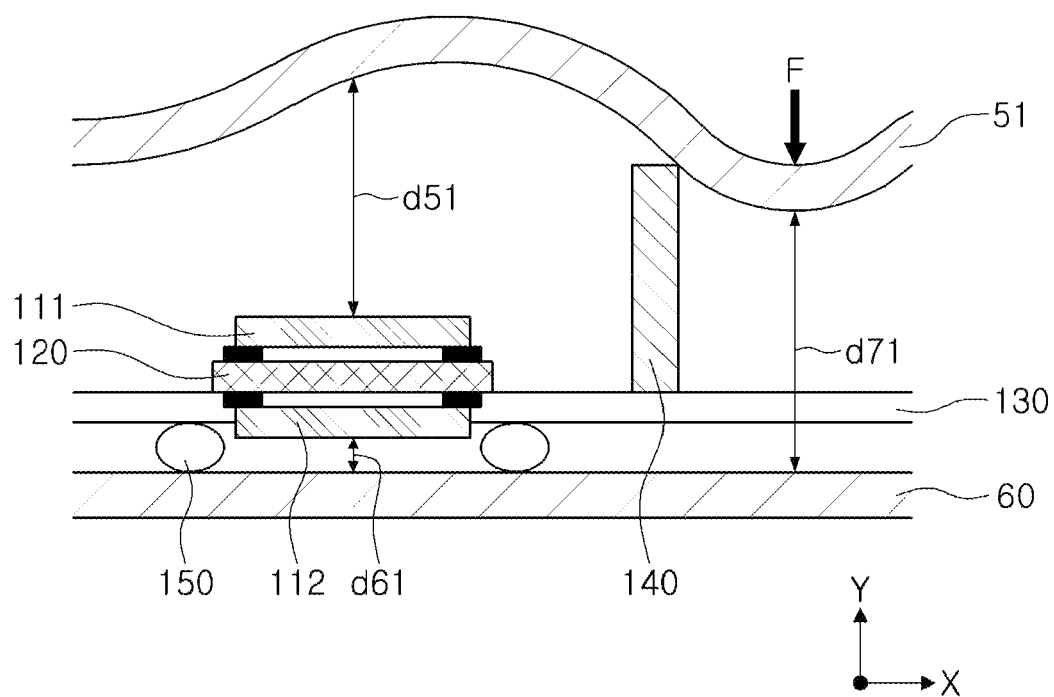
FIG. 11 is a view of a state in which external pressure is applied to a sixth region of FIG. 10, according to an embodiment.

FIG. 10 is a view in which sensing coils are mounted on one surface of the substrate 120 and another surface of the substrate 120. FIG. 11 is a view in a state in which external pressure is applied to a sixth region R6 of FIG. 10.

Comparing 8 and 10, it can be seen that a second sensing coil 112 is further added to the touch sensing device 100 illustrated in FIG. 10. That is, as illustrated in FIG. 10, the touch sensing device 100 may be configured such that a first sensing coil 111 and the second sensing coil 112 are mounted on the one surface and the other surface of the substrate 120, respectively.

More specifically, at least a portion of a support member 130 is formed to be an open region, and the substrate 120 can be fixed at a position including the open region. For example, referring to FIG. 10, some regions corresponding to the lower portion of the support member 130 may be formed to be an open region. The substrate 120 and the first sensing coil 111 may be installed on an upper portion of the support member 130, and the second sensing coil 112 may be installed on a lower portion of the support member 130. Here, since the substrate 120 is fixed to a position including the open region of the support member 130, the sensing coils 111 and 112 can be respectively mounted on the one surface and the other surface of the substrate 120.

The first sensing coil 111 may generate eddy currents due to a change in distance from the housing 51, and the second sensing coil 112 may generate eddy currents due to a change in distance from the lower frame 60. That is, each of the first and second sensing coils 111 and 112 may function as a separate touch sensing device 100. Therefore, even if the same pressure is applied to the sensing circuit unit 200, the force input can be more sensitively detected.

Referring to FIGS. 10 and 11 together, the housing 51 may be divided into a fifth region R5 and a sixth region R6 based on a contact point with the deformation inducing shaft 140. The fifth region R5 may correspond to the third region R3 of FIG. 8 described above, and the sixth region R6 may correspond to the fourth region R4 of FIG. 8 described above. That is, the first sensing coil 111 is disposed below the fifth region R5 of the housing 51, and the fifth region R5 and the sensing coil 111 may be spaced apart by an air gap having a length d5 between the fifth region R5 and the sensing coil 111. The first sensing coil 111 is not disposed directly below the sixth region R6 of the cover member 51.

In addition, according to an embodiment, the sixth region R6 may be determined as the touch switch portion TSW, like the fourth region R4 may be determined as the touch switch portion TSW. That is, when pressure greater than a reference value is applied to the sixth region R6, the touch sensing device 100 may detect that a force input is normally applied.

When external pressure F is applied to the sixth region R6 of the housing 51, deformation of the housing 51 may occur as illustrated in FIG. 11. That is, the sixth region R6, which is a point at which the pressure is directly applied, is bent inwardly (downwardly in FIG. 11) such that a length of a gap between the sixth region R6 and the lower frame 60 is reduced from d7 to d71.

In addition, since the deformation inducing shaft 140 serves as a lever, a point opposite to the point to which the pressure is applied based on the deformation inducing shaft 140 is bent outwardly (upwardly in FIG. 11). Accordingly, the fifth region R5 of the housing 51 is disposed farther from the first sensing coil 111 than before the deformation.

In this case, as described above, since the sixth region R6 is determined as the touch switch portion TSW, FIG. 11 corresponds to a case in which a user applies pressure to the touch switch portion TSW. When a distance between the housing 51 and the touch sensing device 100 increases, the touch sensing device 100 may determine that external pressure is normally applied to the touch switch portion TSW. Therefore, when an air gap of the fifth region R5 increases as shown in FIG. 11, the touch sensing device 100 may generate a normal force input signal.

In addition, since the sixth region R6 is determined as a malfunction portion, when a user applies pressure to the fifth region R5, the pressure applied to the fifth region R5 is not recognized as a normal force input. More specifically, when a user applies pressure to the fifth region R5, the air gap between the first sensing coil 111 and the fifth region R5 is reduced. Therefore, when the air gap of the fifth region R5 decreases, the touch sensing device 100 may determine that the corresponding pressure is not a normal force input applied to the touch switch portion TSW.

Referring to FIG. 10, the second sensing coil 112 may be additionally provided below the support member 130 as described above. As illustrated in FIG. 10, the second sensing coil 112 may be spaced apart from the lower frame 60 by the elastic member 150 provided below the support member 130.

As illustrated in FIG. 11, when a user applies pressure to the sixth region R6, the fifth region R5 of the housing 51 may be bent outwardly by a deformation inducing shaft 140. In this case, the second sensing coil 112 may be close to the lower frame 60 due to compression of the elastic member 150. That is, the length of an air gap formed between the lower frame 60 and the second sensing coil 112 may be reduced from d6 to d61.

It can be seen that the change in the air gap of the first sensing coil 111 and the second sensing coil 112 is different due to the user applying pressure to the sixth region R6. That is, the length of the air gap of the first sensing coil 111 increases from d5 to d51, but the length of the air gap of the second sensing coil 112 decreases from d6 to d61. Accordingly, the touch sensing device 100 may determine that external pressure is normally applied to the touch switch portion TSW by the change in inductance of the first sensing coil 111, and may determine that there is a malfunction by the change in inductance of the second sensing coil 112.

Therefore, in embodiments in which the first and second sensing coils 111 and 112 are provided on one surface and the other surface of the substrate 120, respectively, as illustrated in FIGS. 10 and 11, it is desirable to have a separate sensing circuit units to be implemented for each of the sensing coils 111 and 112. That is, one sensing circuit unit 200 connected to the first sensing coil 111 may be implemented to determined that external pressure is normally applied to the touch switch portion TSW, when the distance between the housing 51 and the first sensing coil 111 increases, as described above. Another sensing circuit unit 200 connected to the second sensing coil 112 may be implemented to determine that external pressure is normally applied to the touch switch portion TSW, when the distance between the lower frame 60 and the second sensing coil 112 decreases.

When the first and second sensing coils 111 and 112 and the sensing circuit units 200 are implemented in this manner, when the user applies pressure to the touch switch portion TSW, both the sensing circuit unit 200 connected to the first sensing coil 111 and the sensing circuit unit 200 connected to the second sensing coil 112 may detect the pressure as a normal force input.

Further, since the touch sensing device 100 as illustrated in FIGS. 10 and 11 also includes the elastic member 150, a change in a distance of an air gap may be increased by compression of the elastic member 150. That is, a change in inductance and a change in resonance frequency of each of the sensing coils 111 and 112 can also be simultaneously increased. Therefore, even if the same pressure is applied to the touch sensing device 100 implemented as described above, the force input can be more sensitively detected.

As set forth above, according to embodiments disclosed herein, a touch sensing device and an electronic device may sense external pressure applied to the electronic device without a mechanical switch protruding externally of the electronic device.

Accordingly, a touch switch integral with an external case may be provided, durability of an electronic device may be improved, and space utilization, and dustproofing and waterproofing effects may be improved.

In addition, since an inverse-detection algorithm detecting an increase in a distance between a housing, such as a housing made of metal or glass, and the sensing coil can be effectively used, it is possible to compensate for malfunctions frequently occurring in the touch sensor.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device, comprising:
at least one sensing coil disposed on a substrate;
a sensing circuit unit configured to detect applied external pressure, based on a change in inductance of the at least one sensing coil;
a support member fixing the substrate; and
a deformation inducing shaft configured to block one side of the at least one sensing coil in one direction and open another side of the at least one sensing coil in another direction,
wherein the substrate and the deformation inducing shaft are disposed in contact with a same surface of the support member.

2. The touch sensing device of claim 1, wherein the deformation inducing shaft is spaced apart from the at least one sensing coil, and has a form of a column or a wall blocking the one side of the at least one sensing coil.

3. The touch sensing device of claim 2, wherein the at least one sensing coil comprises a plurality of sensing coils arranged side-by-side, and
wherein the deformation inducing shaft is disposed between the plurality of sensing coils and is spaced apart from the plurality of sensing coils by different distances.

4. The touch sensing device of claim 1,
wherein the deformation inducing shaft is installed such that one end of the deformation inducing shaft is bonded to the support member and the deformation inducing shaft extends perpendicular to the support member.

5. The touch sensing device of claim 4, further comprising an elastic member disposed on a lower surface of the support member, and configured to be compressed as the external pressure is applied to the support member.

6. The touch sensing device of claim 5, wherein at least a portion of the support member is formed to be an open region, and the substrate is fixed at a position including the open region, and
wherein the at least one sensing coil comprises a first sensing coil mounted on one surface of the substrate and a second sensing coil mounted on another surface of the substrate.

7. An electronic device, comprising:
a housing including a touch switch portion in at least some regions of the housing; and
a touch sensing device disposed inside the housing, and configured to sense external pressure applied to the touch switch portion,
wherein the touch sensing device is configured to determine that external pressure is normally applied to the touch switch portion, in response to a distance between the housing and the touch sensing device increasing beyond a preset reference value.

8. The electronic device of claim 7, wherein the touch sensing device comprises:
at least one sensing coil disposed on a substrate; and
a sensing circuit unit connected to the at least one sensing coil, and configured to detect the external pressure,
wherein the sensing circuit unit is further configured to determine that the external pressure is normally applied to the touch switch portion, in response to the distance between the at least one sensing coil and the housing beyond the preset reference value.

9. The electronic device of claim 8, wherein the touch sensing device further comprises a deformation inducing shaft spaced apart from the at least one sensing coil, and extending perpendicular to the housing.

10. The electronic device of claim 9, wherein the deformation inducing shaft is formed in a column shape or a wall shape on one side of the at least one sensing coil, and is formed to block one side of the at least one sensing coil and open another side of the at least one sensing coil.

11. The electronic device of claim 9, wherein the housing comprises a touch switch portion and a malfunction portion, and
wherein a first region of the housing below which the at least one sensing coil is disposed is determined as a malfunction portion, and a second region of the housing excluding the first region is determined as a touch switch portion, and
wherein the deformation inducing shaft is a boundary between the first region and the second region.

12. The electronic device of claim 11, wherein a vertical distance by which the first region of the housing is spaced apart from the at least one sensing coil increases as external pressure is applied to the touch switch portion.

13. The electronic device of claim 9, wherein the at least one sensing coil comprises a plurality of sensing coils arranged side by side, and
wherein the deformation inducing shaft is disposed between the plurality of sensing coils and is spaced apart from the plurality of sensing coils by different distances.

14. The electronic device of claim 9, wherein the touch sensing device further comprises a support member fixing the substrate, and
wherein the deformation inducing shaft is installed such that one end of the deformation inducing shaft is bonded to the support member and the deformation inducing shaft extends perpendicular to the support member.

15. The electronic device of claim 14, wherein the touch sensing device further comprises an elastic member disposed on a lower surface of the support member, and configured to be compressed as the external pressure is applied.

16. The electronic device of claim 15, wherein at least a portion of the support member is formed to be an open region, and the substrate is fixed at a position including the open region, and
wherein the at least one sensing coil comprises a first sensing coil mounted on one surface of the substrate and a second sensing coil mounted on another surface of the substrate.

17. The electronic device of claim 16, wherein a lower frame is disposed below the elastic member, and the housing is disposed above the support member, and
wherein the first sensing coil is disposed between the support member and the housing, and the second sensing coil is disposed between the support member and the lower frame.

18. The electronic device of claim 17, wherein the sensing circuit unit is further configured to determine that the external pressure is normally applied to the touch switch portion, in response to a distance between the first sensing coil and the housing exceeding a preset reference value, and a distance between the lower frame and the second sensing coil decreasing.

19. A touch sensing device, comprising:
at least one sensing coil disposed on a substrate;
a sensing circuit unit configured to detect applied external pressure, based on a change in inductance of the at least one sensing coil;
a deformation inducing shaft configured to block one side of the at least one sensing coil in one direction and open another side of the at least one sensing coil in another direction;
a support member fixing the substrate; and
an elastic member disposed on a lower surface of the support member and configured to be compressed as the external pressure is applied to the support member,
wherein the deformation inducing shaft is installed such that one end of the deformation inducing shaft is bonded to the support member and the deformation inducing shaft extends perpendicular to the support member.

* * * * *